United States Patent
Xu

(10) Patent No.: US 10,119,690 B2
(45) Date of Patent: Nov. 6, 2018

(54) KIND OF LED LIGHT

(71) Applicant: Yong Xu, Watervliet, NY (US)

(72) Inventor: Yong Xu, Watervliet, NY (US)

(*) Notice: Subject to any disclaimer, the term of this patent is extended or adjusted under 35 U.S.C. 154(b) by 70 days.

(21) Appl. No.: 15/396,310

(22) Filed: Dec. 30, 2016

(65) Prior Publication Data

US 2018/0187875 A1   Jul. 5, 2018

(51) Int. Cl.

| | |
|---|---|
| *F21V 23/00* | (2015.01) |
| *F21V 5/00* | (2018.01) |
| *H05B 37/02* | (2006.01) |
| *H05B 33/08* | (2006.01) |
| *F21S 9/02* | (2006.01) |
| *F21V 9/08* | (2018.01) |
| *F21Y 115/10* | (2016.01) |
| *F21W 121/00* | (2006.01) |

(52) U.S. Cl.
CPC .............. *F21V 23/005* (2013.01); *F21S 9/02* (2013.01); *F21V 5/008* (2013.01); *F21V 9/08* (2013.01); *H05B 33/0845* (2013.01); *H05B 33/0857* (2013.01); *H05B 37/0236* (2013.01); *H05B 37/0272* (2013.01); *F21W 2121/00* (2013.01); *F21Y 2115/10* (2016.08); *H05K 2201/10053* (2013.01)

(58) Field of Classification Search
None
See application file for complete search history.

(56) References Cited

U.S. PATENT DOCUMENTS

| | | | |
|---|---|---|---|
| 2010/0214764 A1* | 8/2010 | Chaves | G02B 6/0096 362/84 |
| 2013/0176707 A1* | 7/2013 | Audette | F21V 29/20 362/84 |
| 2016/0018093 A1* | 1/2016 | Van Winkle | F21V 3/0625 362/311.02 |

FOREIGN PATENT DOCUMENTS

JP   3160808 U  *  7/2010

* cited by examiner

*Primary Examiner* — Charlie Y Peng

(57) ABSTRACT

The present invention is intended to provide a LED light that could display brilliant heart shape rainbow-like lighting effects and offer flexible casing structure for easily extending the hardware capability. It has case and circuit board. The circuit board has Micro Control Unit (MCU), LED chips, micro push buttons and power supply module, etc. The LED chips are electrically connected to the MCU via an output power amplifier module. The micro push buttons are electrically connected to the MCU, and the power supply module offers DC power to the circuit board. Characterized in that: the said case includes ring-shaped plates and end panels which seal one end of the rings; the circuit board is embedded in the inner wall of the surrounding ring-shaped plate; the micro push buttons are soldered on the circuit board and the tops of the micro push buttons extended out of the top panel; the LED chips are located inside the case; the ring-shaped plates and the end panels are made of transparent material; the width along the radial direction is not the same along the circumferential direction of the ring-shaped plate of the case.

10 Claims, 8 Drawing Sheets

KIND OF LED LIGHT

BACKGROUND OF THE INVENTION

1. Field of the Invention

The present invention relates to a kind of LED light.

2. Discussion of the Related Art

The conventional LED light generally has several LED lights on the circuit board and uses manufacturer burnt fixed code to control the LEDs to display some predefined patterns and colors.

Such LED light limited by its simple structure, could only display simple colors that RGB LED chip could display. They could not display brilliant rainbow-like lighting effects. In addition, the user of the conventional light could not freely adjust the shape and structure of the light casing to extend the functionality of the light according to their new needs. The very limited buttons and switches on the conventional LED light also limit the possibility of extending the features of the light by reprogramming the MCU.

SUMMARY OF THE INVENTION

The present invention is intended to provide a LED light that could display brilliant heart shape rainbow-like lighting effects and offer flexible casing structure for easily extending the hardware capability.

The present invention has case and circuit board. The said circuit board has Micro Control Unit (MCU), LED chips that are electrically connected to the MCU via an output power amplifier module, micro push buttons which are electrically connected to the MCU, and power supply module that offers DC power to the circuit board. Characterized in that: the said case includes ring-shaped plates and end panels which seal one end of the rings; the circuit board is mounted in the inner wall of the surrounding ring-shaped plate; the tops of the micro push buttons which are soldered on the circuit board and extended out of the top panel; the LED chips located inside the case; the ring-shaped plates and the end panels are made of transparent material; the width along the radial direction is not the same along the circumferential direction of the ring-shaped plate of the case.

The advantage of the present invention: the width along the radial direction is not the same along the circumferential direction of the ring-shaped plate; the uneven wall thickness of the transparent ring-shaped plate creates lens effect to the outgoing LED emitted light beams. The light beam passing through the transparent plate is scattered. At the meantime, the light passing through the different plates and end panels get reflection and refraction effects. With these light reflection, refraction, and scattering effects, user could see brilliant heart shape rainbow-like light beams around the LED light.

In the present invention, the ring-shaped plates include at least three plates superimposed together—the upper plate, the middle plate, and the lower plate; the circuit board is embedded into the open hole of the middle plate; the upper plate covers the edges of the top side of the circuit board and located on the top side of the middle plate; the lower plate covers the edges of the bottom side of the circuit board and located on the bottom side of the middle plate; the width of the ring-shaped plate along the circumferential direction are not the same for the upper, middle, and lower plates. The structure of superimposing multiple plates together makes it easy to manufacture and assemble. At the meantime, by using the superimposed transparent plates, multiple layers of lens are formed. The light passing through the different plates and end panels results in light reflection, refraction, and scattering effects to allow user to see brilliant heart shape rainbow-like light beams around the LED light.

In the present invention, the circuit board has polygon shape, the embedding hole of the middle sheet has the corresponding polygon shape as the circuit board, and the adjacent edges of the embedding hole are connected by arcuate lines to eliminate stress concentration and prevent breakage while embedding the circuit board into the middle plate.

In the present invention, the circuit board has symmetrical pentagon shape, the case has heart shape, and the multiple LED chips symmetrically arranged along the symmetry axis of the circuit board. Such arrangement makes the design more beautiful and attractive. The circuit board has symmetrical pentagon shape looking like gorgeous diamond.

In the present invention, there is program downloading port which is electrically connected to the MCU. Students and electronic fans could learn programming and download their own customized LED light control program to the MCU through this downloading port to get personalized light control.

In the present invention, there is infrared receiver electrically connected to the MCU. By using IR remote controller sending out control signal, the infrared receiver could forward the signal to MCU to control the LED light.

In the present invention, there are multiple micro push buttons, which are electrically connected to the ADC ports of the MCU through the resistor networks to perform the analog to digital conversion. Any one or two buttons being pushed down will generate different voltage at the ADC port of the MCU. Such multiple micro push buttons are grouped together as a button group and connected to an ADC port of the MCU. The MCU could read the analog to digital conversion value and figure out which button in the button group was pushed down. The program running in MCU could perform relative action and response to the button click. Multiple button groups could connect to different ADC ports of the MCU and then the program running in the MCU could response to the multiple combinations of button clicks. In such way, the combination of multiple button clicks could result in much more possibilities than the number of the physical buttons. Therefore the design could save the number of buttons and ADC ports and do much more types of control to the LED chips.

In the present invention, there are sensor modules and serial communication module that are electrically connected to the MCU. The sensor modules could be the sound sensor module, light sensor module, PIR motion sensor module, etc. By using different sensor module, the MCU could receive different environment signal and perform different personalized control to the LED light. Such as using sound sensor to control the LED light via the sound or using the light sensor to switch on or off the lights according to the brightness of the surrounding environment. The serial communication module allows user to connect the LED light with a computer and control the LED light on the computer. Furthermore, the serial communication module includes serial to network adaptor module, therefore the LED light could be connected to the internet as an IoT device and user could remote control the LED light via internet as well.

In the present invention, the aforementioned LED light comprises bottom panel and the power supply module includes battery box and USB port. The battery box, serial communication module, and sensor modules are mounted in between the bottom panel and the bottom side of the circuit board for easy disassembly and prevent them from hiding LED beams. The bottom panel, ring-shaped plates, and top panel are connected with a detachable structure. Such structure of building blocks allows user to easily stack up and assemble cases of many different sizes, appearances and features according to the selection of power supply method, sensor module size, and case color, etc.

In the present invention, colorful transparent sheets are placed adjacent to the end panels in order to select different colors of the case and make the LED light much more attractive and spectacular.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

Figure 1:
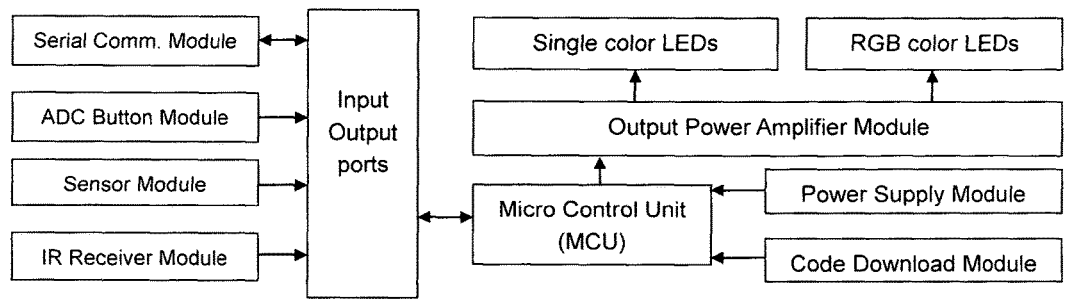
FIG. 1 The electronic modules block diagram of the Smart Heart Programmable LED Light.

In the figures: 1. Micro Control Unit (MCU) 2. Power amplifier module 3. Program download port 4. RGB LED chip 5. Single color LED chip 6. ADC micro push button 7. Serial communication module interface 8. first sensor module interface 9. Second sensor module interface 10. IR receiver 11. USB port 12. Micro push button top panel 13. Colorful transparent text layer sheet 131. light beam passing through hole 132. Light beam passing through slot 14. Socket positioning and gap control plate 15. Circuit board pressing and gap control plate 16. Circuit board 17. Circuit board positioning and gap control plate 171. embedding hole 172. arcuate line 19. Circuit board support and gap control plate 21. Sensor module 22. Colorful transparent sheet for battery box and sensor module 23. Battery box and sensor module mounting plate 231. Wall mount hole 232. Switch slot of the battery box 233. Sensor sensitivity adjusting slot 234. Battery box switch 24. Battery box 25. Isolating studs 26. Wall mounting bottom plate 261. Wall mount hole 27. colorful transparent bottom panel sheet.

DETAILED DESCRIPTION OF THE ILLUSTRATED EMBODIMENTS

Embodiment 1

Figure 2:
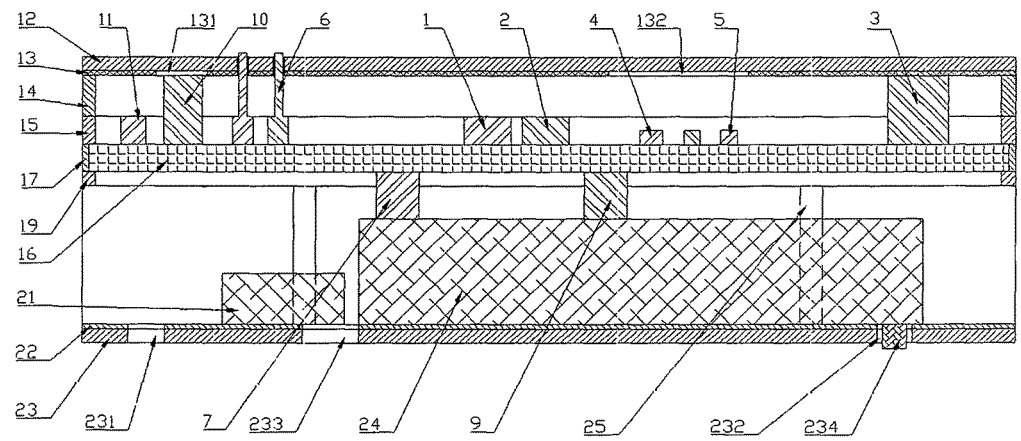
FIG. 2 Side view schematic diagram of the Smart Heart Programmable LED Light (with battery box and sensor) (A-A section view in FIG. 3)
Figure 3:
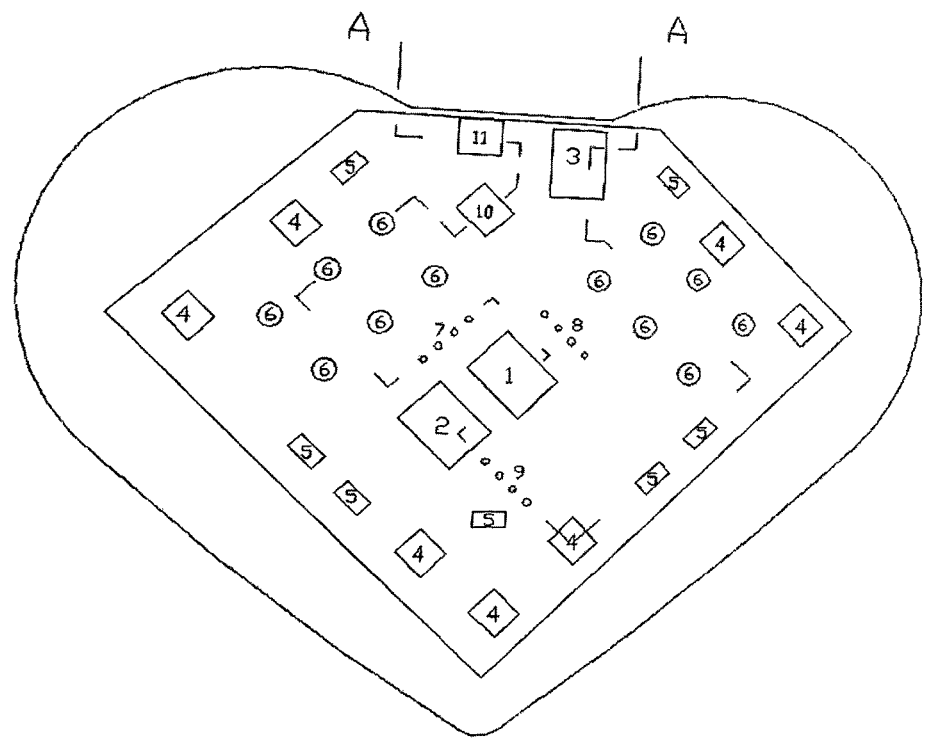
FIG. 3 Top view schematic diagram of the Smart Heart Programmable LED Light.
Figure 4:
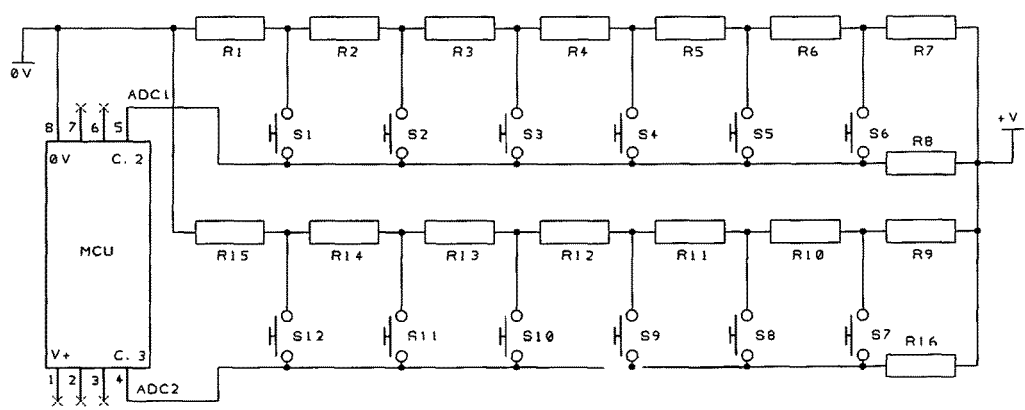
FIG. 4 Schematic diagram showing two button groups electrically connected to the MCU.
Figure 5:
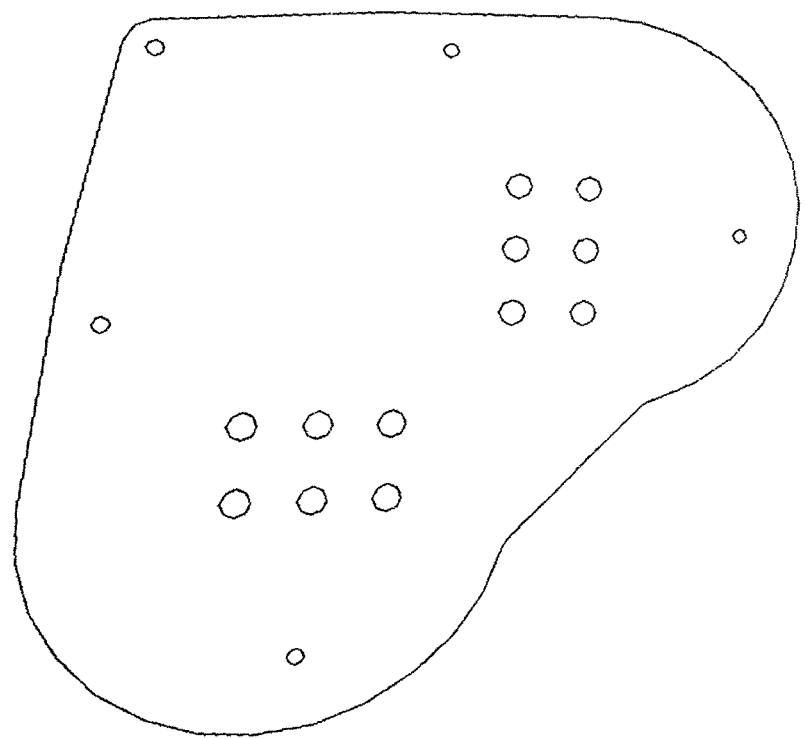
FIG. 5 Schematic diagram of the micro push button top panel.
Figure 6:
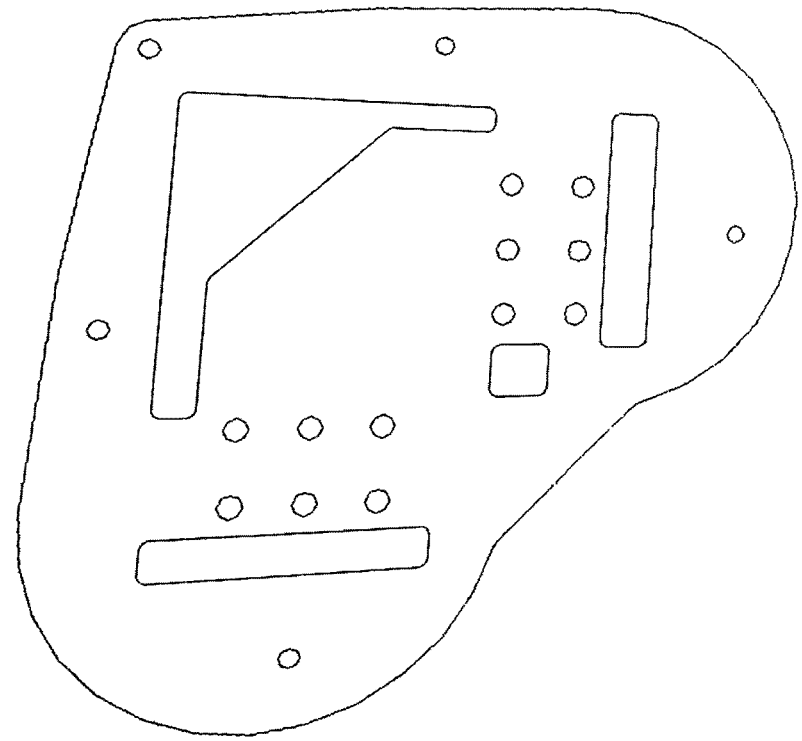
FIG. 6 Schematic diagram of the colorful transparent text layer sheet.
Figure 7:
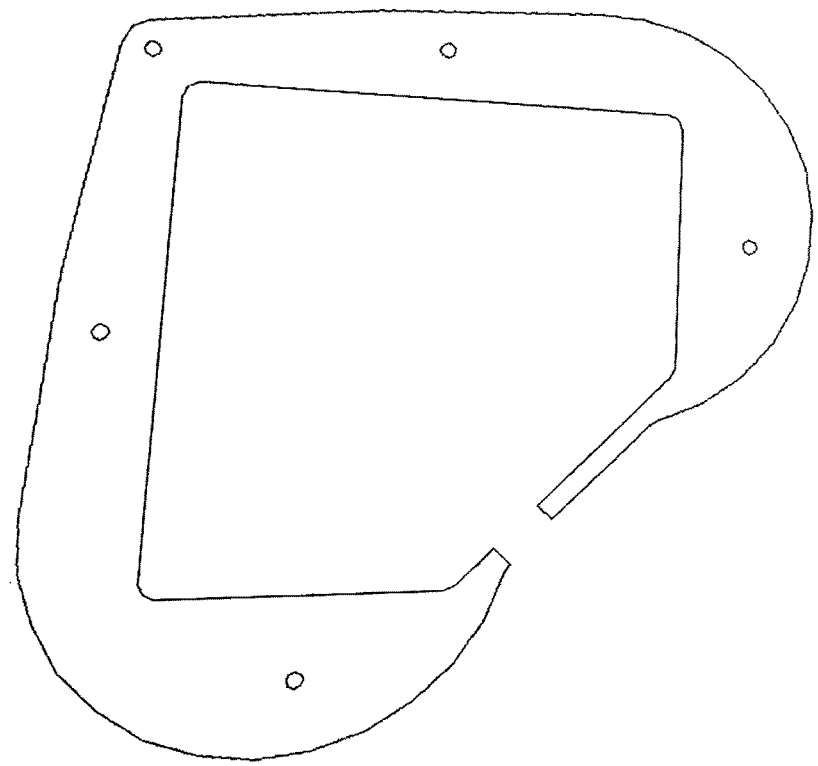
FIG. 7 Schematic diagram of the socket positioning and gap control plate.
Figure 8:
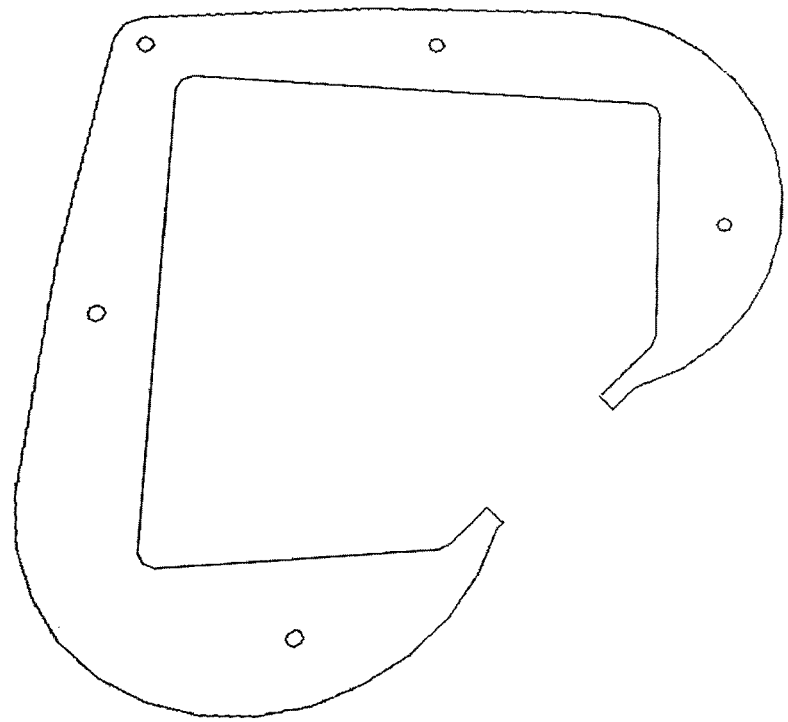
FIG. 8 Schematic diagram of the circuit board pressing and gap control plate.
Figure 9:
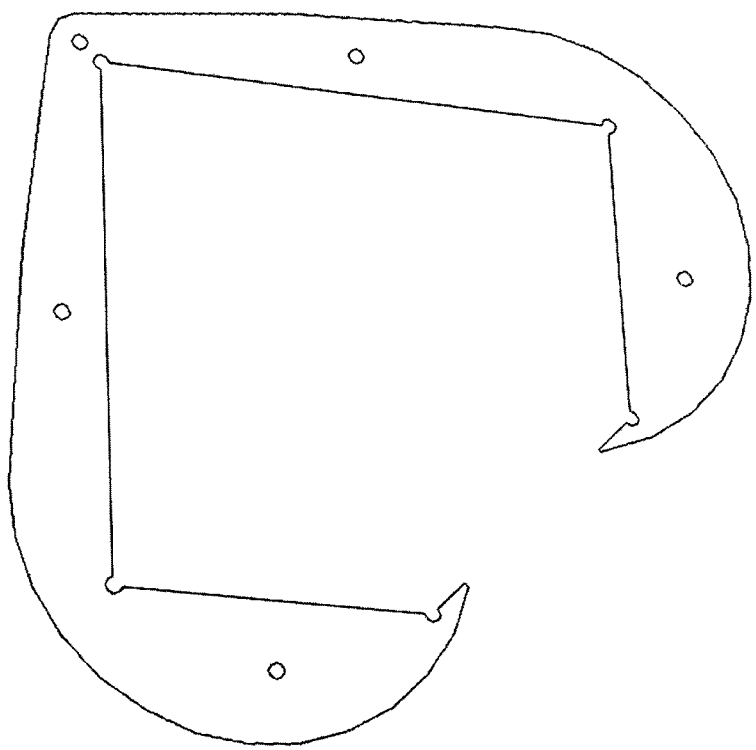
FIG. 9 Schematic diagram of the circuit board positioning and gap control plate.
Figure 10:
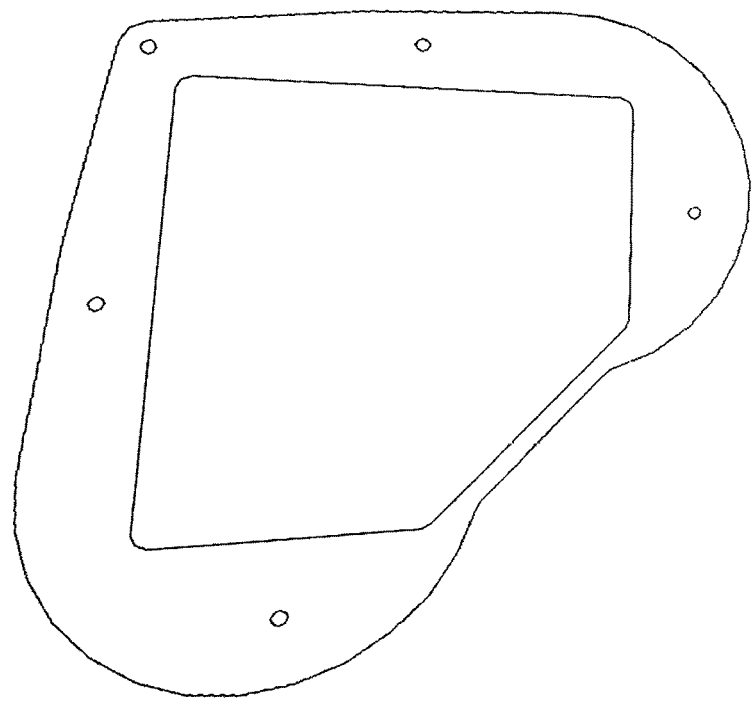
FIG. 10 Schematic diagram of the circuit board support and gap control plate.
Figure 11:
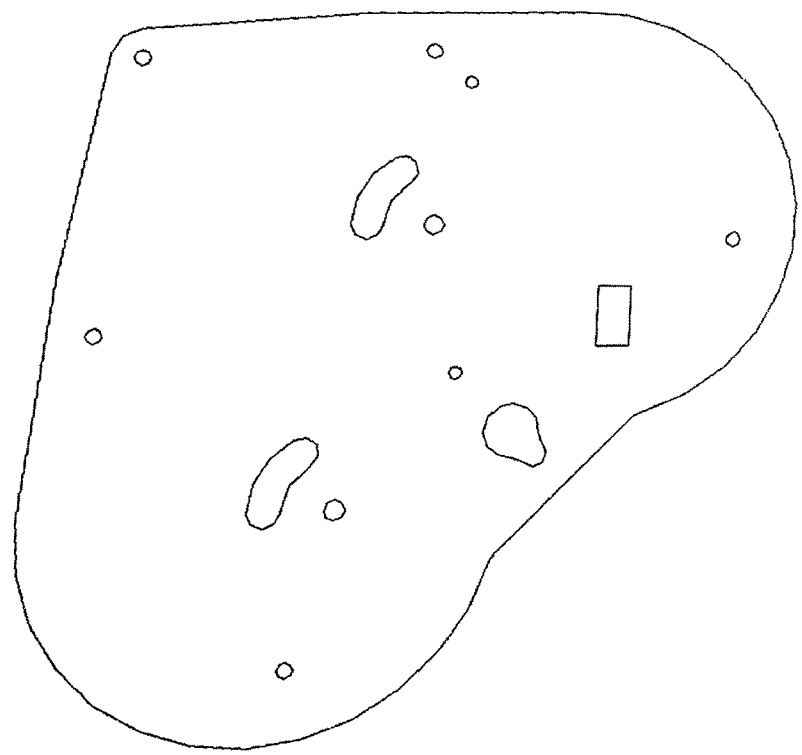
FIG. 11 Schematic diagram of the colorful transparent sheet for battery box and sensor module.
Figure 12:
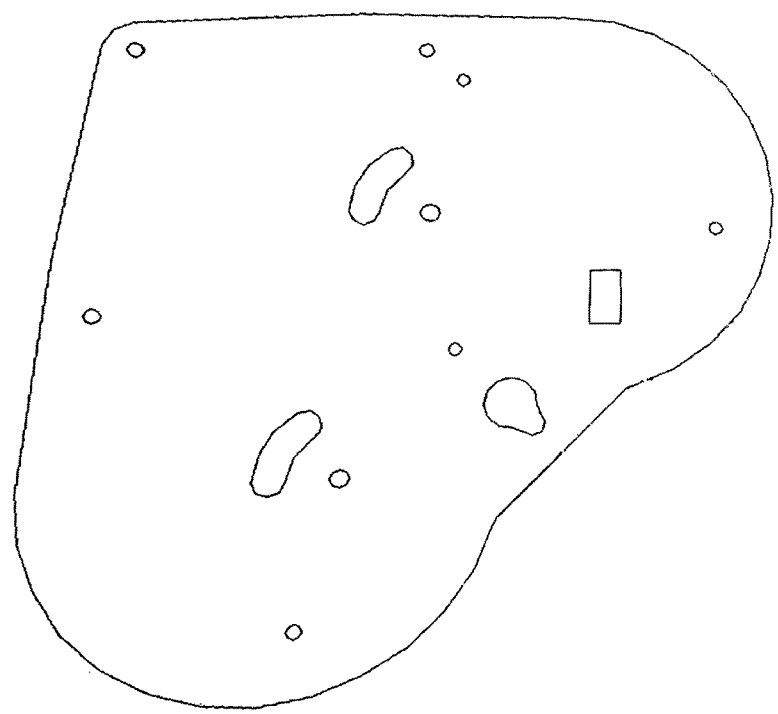
FIG. 12 Schematic diagram of the battery box and sensor module mounting plate.
Figure 13:
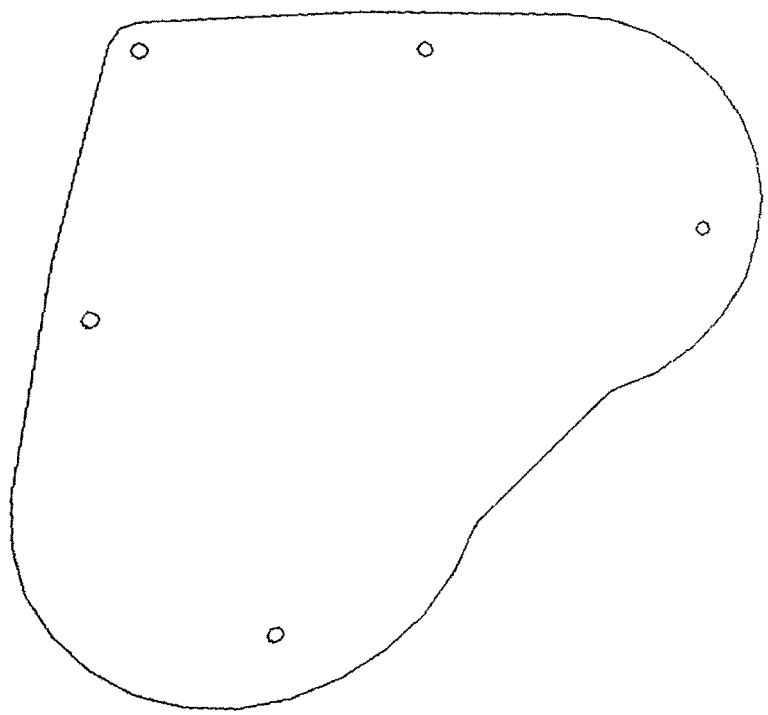
FIG. 13 Schematic diagram of the colorful transparent bottom panel sheet.
Figure 14:
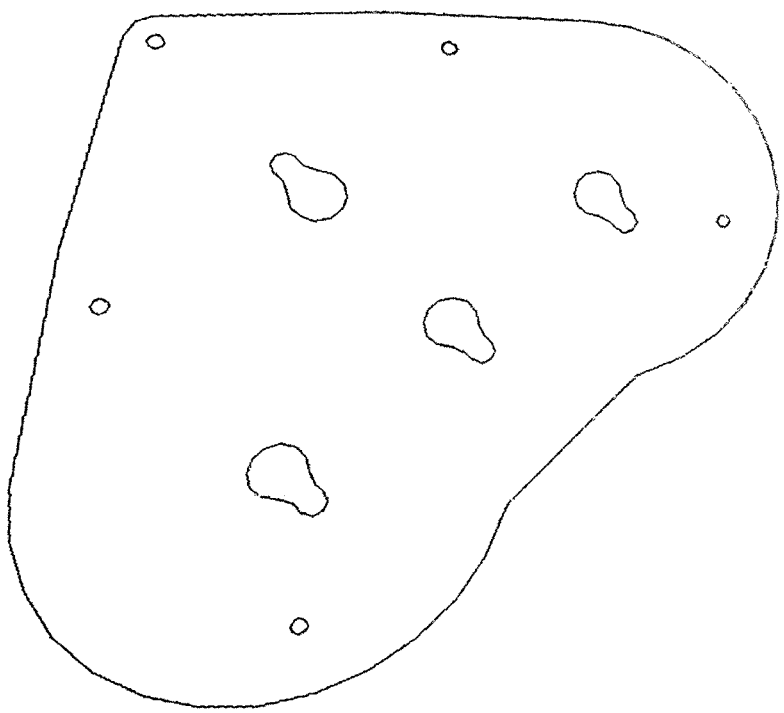
FIG. 14 Schematic diagram of the wall mounting bottom plate of the Smart Heart Programmable LED Light.
Figure 15:
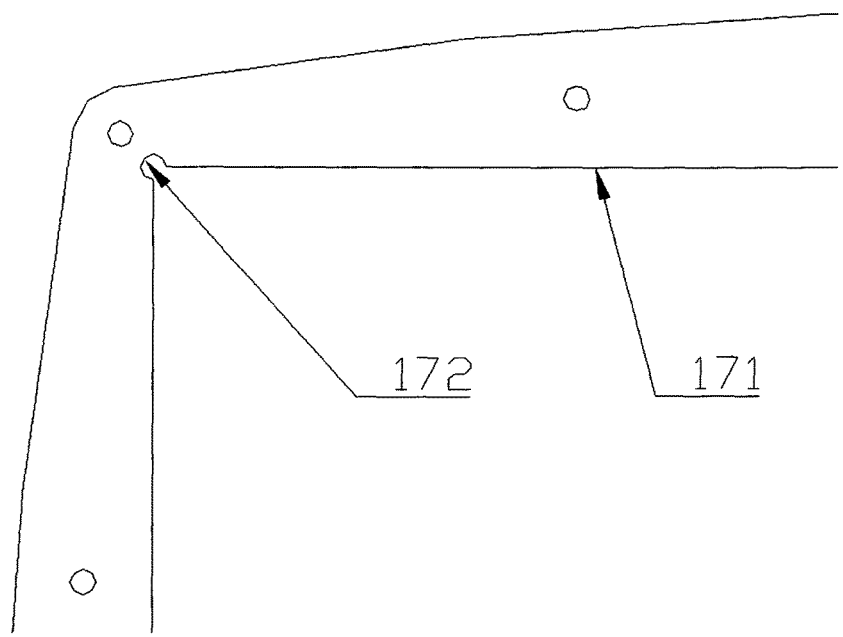
FIG. 15 Embedding hole partially enlarged schematic diagram of the circuit board positioning and gap control plate.

Referring to FIG. 1, FIG. 2, and FIG. 3 for the Smart Heart Programmable LED Light, it includes top panel, colorful transparent sheets, ring-shaped plates, circuit board, and bottom panel.

Circuit board 16 possesses electrically connected Micro Control Unit (MCU) 1; power amplifier module 2; software download module 3; seven dimmable and color adjustable RGB LED chips 4; seven single color LED chips 5; two groups of ADC micro push buttons 6; serial communication module interface 7; signal 10 and power input interface 9; IR receiver 10; USB interface 11; sensor module 21; battery box 24, etc. Each group of ADC micro push buttons consists of 6 micro push buttons.

The unique design of the heart shaped case is composed of multiple layers of heart shaped transparent plastic end panels and ring-shaped plates. The case includes micro push button top panel 12; colorful transparent text layer sheet 13 which is put adjacent to the micro push button panel; and ring shaped plates. The superimposed ring-shaped plates include socket positioning and gap control plate (one of the upper plates) 14; circuit board pressing and gap control plate (the other one of the upper plates) 15; circuit board positioning and gap control plate (middle plate) 17; circuit board support and gap control plate (lower plate) 19.

The bottom end panel includes heart-shaped battery box and sensor module mounting plate 23; colorful transparent sheet for battery box and sensor module 22.

The circuit board 16 is embedded into the embedding hole 171 of the circuit board positioning and gap control plate 17; The circuit board pressing and gap control plate 15 is located on top of circuit board positioning and gap control plate 17 and on the top layer of the circuit board 16 and around the edges of the circuit board; The circuit board support and gap control plate 19 is located at the bottom of the circuit board positioning and gap control plate 17 and at the bottom layer of the circuit board 16 and around the edges of the circuit board; The circuit board pressing and gap control plate 15, and the circuit board support and gap control plate 19 are used to press and positioning the circuit board 16 into the embedding hole 171 of the circuit board positioning and gap control plate 17; The wall thickness along the circumferential direction of the socket positioning and gap control plate 14, circuit board pressing and gap control plate 15, circuit board positioning and gap control plate 17, circuit board support and gap control plate 19 are all different. The difference in the width (wall thickness) creates lens structure and generates lens effect to the light beams passing through them.

The circuit board has symmetrical pentagon shape (diamond shape). The dimmable and color adjustable RGB LED chip 4, single color LED chip 5, two groups of micro push buttons are all symmetrically arranged along the symmetry axis of the circuit board. USB port 11 and program download port 3 are located at one edge of the pentagon. The dimmable and color adjustable RGB LED chip 4 and the single color LED chip 5 are placed along the other four edges of the pentagon and they could be independently controlled by the MCU.

The diamond shaped circuit board is embedded inside the heart shaped case. By the help of the lens which are created along the edges of the ring shaped plates, the light beams emitted from the LEDs on the circuit board are scattered and formed rainbow like light band around each layer of the ring shaped plates. At the meantime, the light passing through the different plates and end panels results in reflection and refraction effects. With these light reflection, refraction, and scattering effects, user could see brilliant heart shape rainbow-like lighting effects.

The pentagon shaped embedding hole 171 which is located inside the circuit board positioning and gap control plate 17 has adjacent edges which are connected by arcuate lines 172 to eliminate stress concentration at the corners and prevent plate breakage while embedding the circuit board into the plate 17.

Micro push button 6, IR receiver 10, program download port 3, USB port 11, RGB LED chip 4, single color LED chip 5, etc. are located on the top side of the circuit board. The top of the micro push button 6 extends out of the micro push button top panel 12.

The serial communication module interface 7, the first sensor module interface 8, and the second sensor module interface 9 are located on the bottom side of the circuit board. The battery box 24 and the sensor module (such as sound sensor or light sensor, etc.) 21 are mounted on the battery box and sensor module mounting plate 23. The isolating stud 25 is mounted in between the Circuit board support and gap control plate 19 and the colorful transparent sheet for battery box and sensor module 22.

The current invention utilizes the colorful transparent text layer sheet 13 to give different color to the case and mark the functions of the sockets and buttons, etc. User could replace the sheet 13 to select their favorite color for the case of the LED light. User could also replace the colorful transparent sheet for battery box and sensor module 22 accordingly for the bottom color of the case. The micro push button top panel 12, the socket positioning and gap control plate 14, the circuit board pressing and gap control plate 15, the circuit board positioning and gap control plate 17, the circuit board support and gap control plate 19, and the battery box and sensor module mounting plate 23 are connected with a detachable structure. The current invention utilizes multiple layers of transparent plastic boards that bearing specific shape and structure to assemble cases of certain features. Such structure of building blocks allows user to easily stack up and assemble cases of many different sizes, appearances and features according to the selection of power supply method, sensor module size, and case color, etc.

Six micro push buttons are grouped together as a button group and the two button groups connected to two ADC ports on the MCU via two sets of resistor networks to perform analog to digital conversion. In such way, the program running in the MCU reads the two set of ADC values to identity 48 kinds of combined button clicks. Then the MCU could react to the combination button clicks to perform 48 types of control to the LED light. In such way, we could use only 2 ADC ports and 12 buttons to get 48 kinds of user input states, saving limited MCU ports and the amount of buttons.

The Smart Heart Programmable LED Light possesses MCU, two groups of micro push buttons, IR remote control, six groups of independently controllable LED chips, sensor module interfaces and serial communication modules interface. It utilizes modularized design method, makes it easy for user to flexibly select different kinds of sensors and power supplies. It also offers I/O interfaces for further feature extension.

By cutting certain shapes of LED beam passing through slots 132 on color plastic sheet, the colorful transparent text layer sheet 13 could prevent LED beam color being altered by the color sheet. Furthermore, the IR light slot 131 on the color sheet is set on top of the IR receiver to prevent the remote control IR beam being affected by the color sheet. Text could be printed on the color sheet to mark the functions of the sockets and buttons or add some brand information.

The wall mounting hole 231 on the battery box and sensor module mounting plate 23 allows user to hang the LED light on the wall. The switch slot 232 for the battery box and the parameter adjustment slot 233 for the sensor module on the battery box and sensor module mounting plate 23 allow user to easily operate the power supply and adjust the sensitivity of the sensor.

Programming the MCU, user could read ADC values of the two groups of micro push buttons, IR control signal, sensor signal (such as signal coming from sound sensor module, light sensor module, PIR sensor module), as well as the remote network control signal to control the LED light. User could select different power supply method such as battery box, computer USB port, cell phone charger or power bank with USB port.

Running control software which is stored in the MCU of the Smart Heart Programmable LED Light, the LED light could simulate heart beat, light chasing, dimmable light, light color adjusting, favorite color saving and loading, sleeping mode light control, etc. There is program download port on the Smart Heart Programmable LED Light to allow user to write his/her own custom control code for the device. This makes the LED light an educational device for children, students and hobbyists to learn computer application programming, automatic hardware control and basic concept of robotics by reading sensor values and reacting to the events of the surrounding environment. Of course, the LED light could be directly used as a high-tech multifunctional toy for kids or a powerful dimmable night light for daily life.

Embodiment 2

Figure 16:
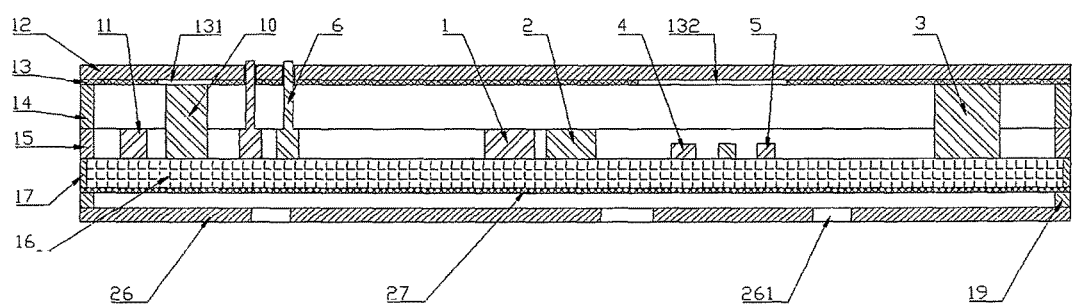
FIG. 16 Side view schematic diagram of the Smart Heart Programmable LED Light (without battery box and sensor) (A-A section view of FIG. 3)

Referring to FIG. 2 and FIG. 16, the differences between embodiment 2 and embodiment 1 are: in the embodiment 2, there are no serial communication module interface 7, sensor module 21, battery box 24, battery box and sensor module mounting plate 23, and colorful transparent sheet for battery box and sensor module 22 that exists in the embodiment 1. In the embodiment 2, there are added wall mounting bottom plate 26, colorful transparent bottom panel sheet 27 which is attached to the circuit board positioning and gap control plate 17. There are multiple wall mount holes 261 on the wall mounting bottom plate 26, allowing users to conveniently mount the Smart Heart Programmable LED Light on the wall in their favorite direction and angle. Other structures are similar to the embodiment 1.

Embodiment 3

User could select other assembly methods in between embodiment 1 and embodiment 2, for example, it has battery box without sensor module, or it has sensor module without battery box.

Embodiment 4

User could select assembly method which has two types of sensor modules without battery box, mounting both a sound sensor module and a PIR motion sensor module onto the battery box and sensor module mounting plate 23. In such way, the LED light could react to either the sound or the human body movement.

Embodiment 5

User could replace the battery box with serial communication module and remote control the LED light via the internet.

The invention claimed is:

1. A kind of LED light comprising a case and a circuit board, the circuit board comprising: a Micro Control Unit (MCU); LED chips which are electrically connected to the MCU via an output power amplifier module; micro push buttons which are electrically connected to the MCU; and a power supply module that offers DC power to the circuit board, wherein said case includes ring-shaped plates and end panels which seal one end of the ring-shaped plates; the circuit board is mounted in the inner wall of the ring-shaped plates surrounding it; wherein the tops of the micro push buttons, which are soldered on the circuit board, extend out of the top panel; wherein the LED chips are located inside the case; wherein the ring-shaped plates and the end panels are made of a transparent material; and wherein the width along the radial direction is not the same along the circumferential direction for the ring-shaped plates of the case.

2. The LED light of claim 1, characterized in that: the ring-shaped plates include at least three plates superimposed together—an upper plate, a middle plate, and a lower plate; the circuit board is embedded into an open hole of the middle plate; the upper plate covers edges of the top side of the circuit board and is located on the top side of the middle plate; the lower plate covers edges of the bottom side of the circuit board and is located on the bottom side of the middle plate; the width of the ring-shaped plate along the circumferential direction are not the same for the upper, middle, and lower plates.

3. The LED light of claim 2, characterized in that: the circuit board has polygon shape; an embedding hole of the middle plate has the corresponding polygon shape as the circuit board; adjacent edges of the embedding hole are connected by arcuate lines.

4. The LED light of claim 1, characterized in that: the circuit board has a symmetrical pentagon shape; the case has heart shaping; there are multiple LED chips symmetrically arranged along a symmetry axis of the circuit board.

5. The LED light of claim 1, wherein a program downloading port, which is used to download control code into the MCU, is electrically connected to the MCU.

6. The LED light of claim 1, wherein an infrared receiver is electrically connected to the MCU.

7. The LED light of claim 1, characterized in that: there are multiple micro push buttons, which are electrically connected to ADC ports of the MCU via resistor networks to perform the analog to digital conversion; any one or two of the micro push buttons being pushed down will generate different voltage at the ADC port of the MCU.

8. The LED light of claim 1, wherein sensor modules and a serial communication module are electrically connected to the MCU.

9. The LED light of claim 8, characterized in that: it comprises bottom panel; the power supply module includes a battery box and a USB port; the battery box, the serial communication module, and the sensor modules are mounted in between the bottom panel and the bottom side of the circuit board; the bottom panel, the ring-shaped plates, and the top panel are connected with a detachable structure.

10. The LED light of claim 1, wherein colorful transparent sheets are placed adjacent to the end panels.

* * * * *